United States Patent
Ku et al.

(10) Patent No.: US 7,242,187 B1
(45) Date of Patent: Jul. 10, 2007

(54) HALL EFFECT SWITCHING CIRCUIT AND APPARATUS AND METHOD USING THE SAME

(75) Inventors: Ming-Hua Ku, Hsinchu (TW);
Ching-Hsieng Lee, Hsinchu (TW)

(73) Assignee: Anachip Corporation (TW)

( * ) Notice: Subject to any disclaimer, the term of this patent is extended or adjusted under 35 U.S.C. 154(b) by 80 days.

(21) Appl. No.: 11/405,459

(22) Filed: Apr. 18, 2006

(51) Int. Cl.
*G01R 33/07* (2006.01)
(52) U.S. Cl. .................... 324/251; 324/207.2
(58) Field of Classification Search ............... 324/251, 324/207.2
See application file for complete search history.

(56) References Cited

U.S. PATENT DOCUMENTS 6,861,839 B2 * 3/2005 Hara et al. ................ 324/251
7,049,812 B2 * 5/2006 Hara et al. ................ 324/251

* cited by examiner

*Primary Examiner*—Bot LeDynh
(74) *Attorney, Agent, or Firm*—Lowe Hauptman & Berner, LLP

(57) ABSTRACT

A Hall Effect switching circuit and apparatus and method using the same are disclosed. The Hall Effect switching circuit comprises a power supply device, a Hall Effect detecting device and a buffer. The power supply device provides operation power to the Hall Effect detecting device. The Hall Effect detecting device provides a first triggering signal to a first output pin and a second triggering signal to a second output pin in accordance to a magnetic field through the Hall Effect detecting device. The buffer receives and buffers the voltage levels of the first/second triggering signals.

12 Claims, 2 Drawing Sheets

HALL EFFECT SWITCHING CIRCUIT AND APPARATUS AND METHOD USING THE SAME

BACKGROUND OF THE INVENTION

1. Field of Invention

The present invention relates to a Hall Effect switching circuit and apparatus using the same. More particularly, the present invention relates to a Hall Effect switching circuit adapted to both N and S magnetic polarities and apparatus and method using the same.

2. Description of Related Art

For recent years, Hall Effect switching circuits using Hall Effect sensors are widely implemented to detect position change or revolution of objects. For example, a Hall Effect switching circuit is embedded in top cover (or bottom cover) to detect the distance between the top and bottom covers such that the power supply is controlled in accordance to the detected result.

Refer to FIG. 1, a prior art Hall Effect switching circuit is shown therein. The Hall Effect switching circuit 10 comprises a Hall IC 100, amplifier 110, Schmitt trigger circuit 120 and transistor 130. Firstly, the Hall IC 100 determines output voltage levels in accordance to the magnetic flux thereon. The output voltage level is amplified by the amplifier 110 and the amplified output voltage level is determined whether or not it is bigger than a predetermined value by the Schmitt trigger circuit 120. The determined result is used for controlling whether to conduct the transistor 130.

However, this kind of Hall Effect switching circuit is designed for detecting only one magnetic polarity, either N or S. Those who want to implement the Hall Effect switching circuit suffer to select a specific magnetic field generator in order to make the whole system function correctly.

SUMMARY OF THE INVENTION

Accordingly, one of the objects of the invention is to provide a Hall Effect switching circuit and apparatus and method using the same such that the Hall Effect switching circuit can be adapted to both N and S magnetic polarities.

To at least achieve the above and other objects, the invention provides a Hall Effect switching circuit, which comprises a power supply apparatus, a magnetic detecting apparatus and a buffer unit. The power supply apparatus provides an operation power to the magnetic detecting apparatus. The magnetic detecting apparatus comprises a magnetic north pole detecting unit and magnetic south pole detecting unit. The magnetic north pole detecting unit has a first sensing unit and a first comparator, detects a field intensity of magnetic north pole for obtaining a first detected result by using the first sensing unit, and determines a voltage level of a first triggering signal outputting to a first output terminal in accordance to a compare result obtained from comparing the first detected result with a predetermined value by using the first comparator. The magnetic south pole detecting unit has a second sensing unit and a second comparator, detects a field intensity of magnetic south pole for obtaining a second detected result by using the second sensing unit, and determines a voltage level of a second triggering signal outputting to a second output terminal in accordance to a compare result obtained from comparing the second detected result with a predetermined value by using the second comparator. The buffer unit receives and buffers the voltage levels of the first triggering signal and the second triggering signal.

In one embodiment, the Hall Effect switching circuit further comprises an OR gate having two input terminals respectively coupled to the buffer unit for receiving the first triggering signal and the second triggering signal. The OR gate performs an OR logic operation on the first and second triggering signals to generate a control signal. Moreover, the Hall Effect switching circuit may further comprise a switch coupled to the OR gate to receive the control signal such that the switch is determined whether to be turned on or not in accordance to the control signal.

In another aspect, the present invention provides an apparatus using Hall Effect switching circuit. The apparatus comprises a magnetic field generator and a Hall Effect switching circuit. The magnetic field generator generates a magnetic field. The Hall Effect switching circuit comprises a power supply apparatus, a magnetic detecting apparatus and a buffer unit. The power supply apparatus provides an operation power to the magnetic detecting apparatus. The magnetic detecting apparatus comprises a magnetic north pole detecting unit and magnetic south pole detecting. The magnetic north pole detecting unit has a first sensing unit and a first comparator, detects a field intensity of magnetic north pole for obtaining a first detected result by using the first sensing unit, and determines a voltage level of a first triggering signal outputting to a first output terminal in accordance to a compare result obtained from comparing the first detected result with a predetermined value by using the first comparator. The magnetic south pole detecting unit has a second sensing unit and a second comparator, detects a field intensity of magnetic south pole for obtaining a second detected result by using the second sensing unit, and determines a voltage level of a second triggering signal outputting to a second output terminal in accordance to a compare result obtained from comparing the second detected result with a predetermined value by using the second comparator. The buffer unit receives and buffers the voltage levels of the first triggering signal and the second triggering signal.

In still another aspect, the present invention further provides a method for using Hall Effect switching circuit, wherein the Hall Effect switching circuit comprises a magnetic north pole detecting unit and a magnetic south pole detecting unit; furthermore, the magnetic north pole detecting unit has a first sensing unit and a first comparator, and the magnetic south pole detecting unit has a second sensing unit and a second comparator. The method comprises the steps of using the magnetic north pole detecting unit to detecting a field intensity of magnetic north pole when operation power is provided to the magnetic north pole detecting unit, such that a corresponding first triggering signal is generated accordingly; using the magnetic south pole detecting unit to detecting a field intensity of magnetic south pole when operation power is provided to the magnetic south pole detecting unit, such that a corresponding second triggering signal is generated accordingly; and buffering the first and second triggering signal respectively for controlling circuit operation.

The magnetic field of magnetic north pole (N) and magnetic south pole (S) can be detected by using the Hall Effect switching circuit provided by the present invention. Accordingly, the triggering unit is not limited to detect magnetic field of a specified polarity. Therefore, it is more convenient for the producers to design and produce a relative product.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
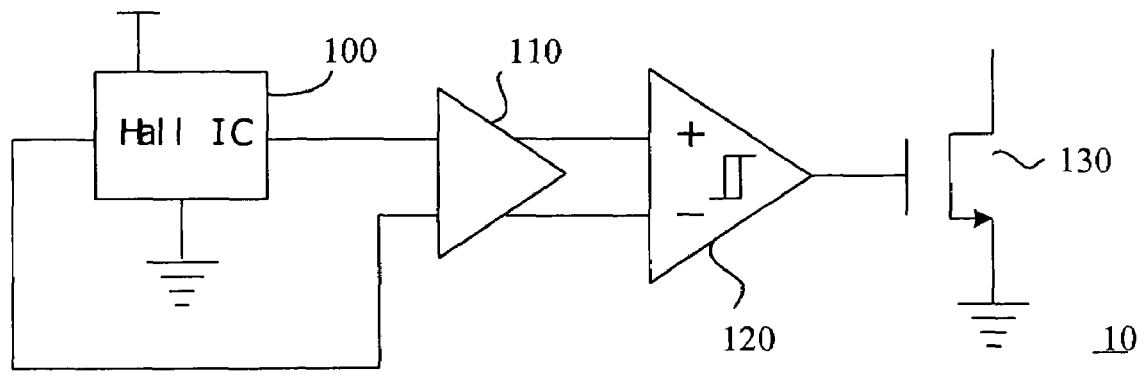
FIG. 1 is a conventional Hall Effect switching circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
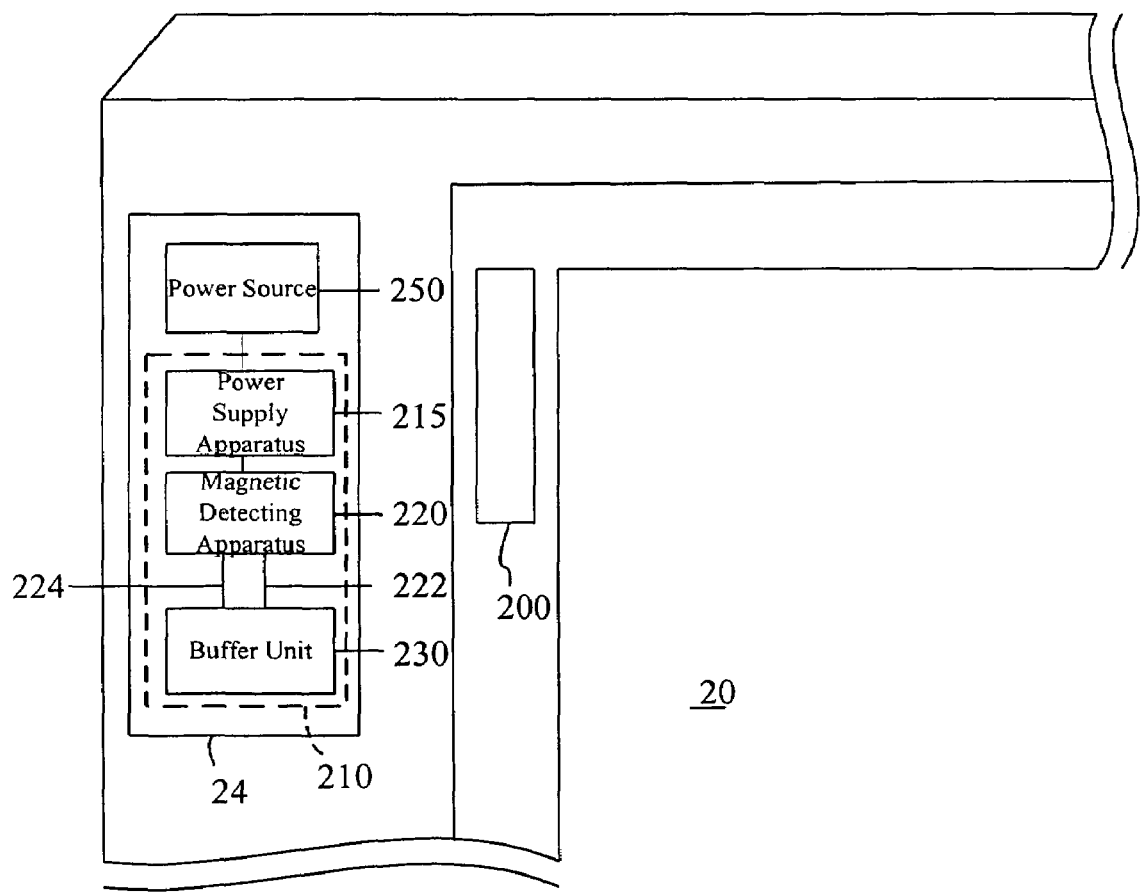
FIG. 2 is a circuitry block diagram of an apparatus using the Hall Effect switching circuit according to one embodiment of the present invention.

Refer to FIG. 2, a circuitry block diagram of an apparatus using the Hall Effect switching circuit according to one embodiment of the present invention is shown therein. In the embodiment, the apparatus 20 comprises two parts, one of which is a magnetic field generator 200 embedded on the window while another one of which is a Hall Effect switching circuit 210 embedded on the window frame and a power source 250 for supplying power to the Hall Effect switching circuit 210. The Hall Effect switching circuit 210 detects magnetic flux caused by the magnetic field generated from the magnetic field generator 200. The detected result may be used as a reference to determine whether the window is properly closed or not and, accordingly, the apparatus 20 can be used as a basic element of a burglar alarm.

The aforementioned Hall Effect switching circuit 210 comprises power supply apparatus 215, magnetic detecting apparatus 220 and buffer unit 230. The power supply apparatus 215 converts power provided by the power source 250 into an operation power and provides the operation power to the magnetic detecting apparatus 220. To save power consumption, the power supply apparatus 215 might periodically turns ON/OFF provision of the operation power since variation of magnetic field is seldom occurred. In other words, by implementing proper firmware or oscillator, a periodically signal can be provided to control the power supply apparatus 215 for determining whether to provide the operation power or not.

The magnetic detecting apparatus 220 detects field intensities of magnetic north pole (N) and magnetic south pole (S) when the power supply apparatus 215 provides the operation power thereto. The detected intensities are correspondingly converted into two triggering signals. The two triggering signals are provided to the buffer unit 230 via the output terminal 222 and 224, respectively. The buffer unit 230 receives and buffers voltage levels of the triggering signals. Once the power supply apparatus 215 stops providing the operation power, the magnetic detecting apparatus 220 is unable to detect intensity of the magnetic field, and, at this time, the buffer unit 230 stops receiving new voltage levels from the output terminals 222 and 224 and keeps the voltage levels received before the power supply apparatus 215 stopping providing the operation power. It is well known by those skilled in the art that the buffer unit 230 can be disabled when the power supply apparatus 230 stops providing operation power, so that the buffer unit 230 does not receive other incoming data.

Figure 3:
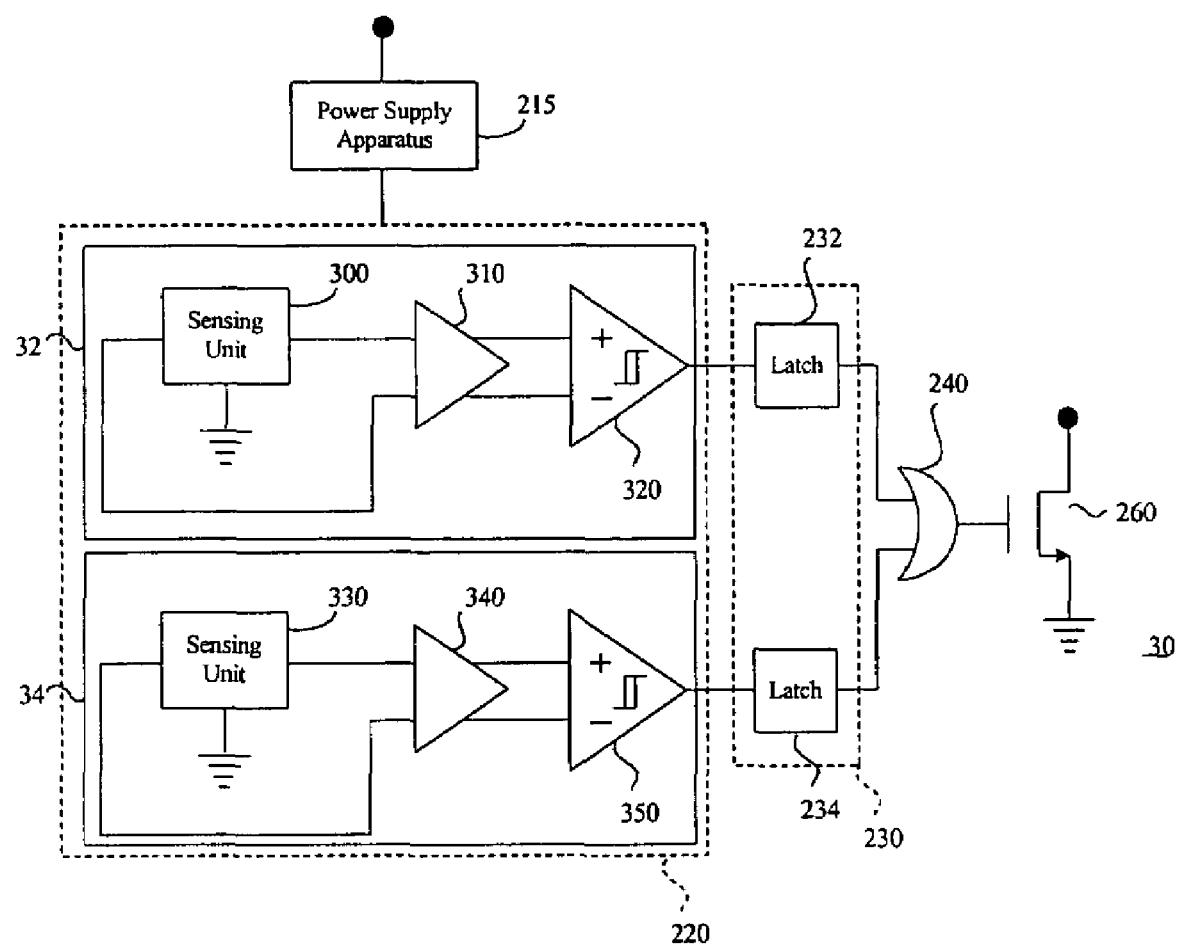
FIG. 3 is a circuitry block diagram of a Hall Effect switching circuit according to one embodiment of the present invention.

Please refer to FIG. 3, a circuitry block diagram of a Hall Effect switching circuit according to one embodiment of the present invention is shown therein. In the embodiment, the Hall Effect switching circuit 30 not only comprises power supply apparatus 215, magnetic detecting apparatus 220 and buffer unit 230 as shown in FIG. 2, but also comprises an OR gate 240 and a switch (in the embodiment, a transistor) 260 controlled by the OR gate 240.

The embodiment provides two sets of magnetic detecting unit in the magnetic detecting apparatus 220. The magnetic detecting unit 32, which is referred to as magnetic north pole detecting unit, comprises a sensing unit 300, an amplifier 310 and a comparator 320 and is used for detecting field intensity of north pole magnetic field. Similarly, the magnetic detecting unit 34, which is referred to as magnetic south pole detecting unit, comprises a sensing unit 330, an amplifier 340 and a comparator 350 and is used for detecting field intensity of south pole magnetic field.

The sensing unit 300 in the magnetic north pole detecting unit detects magnetic intensity of north pole magnetic field, converts the detected magnetic intensity into a corresponding voltage signal and provides the voltage signal to the amplifier 310. The amplifier 310 amplifies the voltage signal and provides the amplified voltage signal to the comparator 320. The comparator 320 outputs voltage levels of which the triggering signal consists to the output terminal 222 in accordance to the received amplified voltage signal. Similarly, the sensing unit 330 in the magnetic south pole detecting unit detects magnetic intensity of south pole magnetic field, converts the detected magnetic intensity into a corresponding voltage signal and provides the voltage signal to the amplifier 340. The amplifier 340 amplifies the voltage signal and provides the amplified voltage signal to the comparator 350. The comparator 350 outputs voltage levels of which the triggering signal consists to the output terminal 224 in accordance to the received amplified voltage signal.

Moreover, two latches 232 and 234 are provided in the buffer unit 230 of the present embodiment such that the latch 232 receives and latches the triggering signal from the output terminal 222 and the latch 234 receives and latches the triggering signal from the output terminal 224. The latched triggering signals are sent to the OR gate 240 for performing an OR logic operation. A control signal is obtained from the OR logic operation and is used to control ON/OFF status of the switch 260.

Specifically, the aforementioned comparators 320 and 330 can be Schmitt trigger circuits or normal comparators.

Accordingly, the present invention provides a method that utilizes a magnetic north pole detecting unit and a magnetic south pole detecting unit, which respectively comprises an independent comparator, to separately detects magnetic intensity of different polarities. In one embodiment, the magnetic north pole detecting unit detects a field intensity of magnetic north pole when operation power is provided to the magnetic north pole detecting unit, such that a corresponding first triggering signal is generated accordingly. Similarly, the magnetic south pole detecting unit detects a field intensity of magnetic south pole when operation power is provided to the magnetic south pole detecting unit, such that a corresponding second triggering signal is generated accordingly. Finally, the voltage levels of the first and second triggering signals are stored for controlling circuit operation.

By operating as aforementioned method, the Hall Effect switching circuit can detects both N and S magnetic fields. Accordingly, the triggering unit is not limited to detect magnetic field of a specified polarity. Therefore, it is much more convenient for the producers to design and produce a relative product.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A Hall Effect switching circuit, comprising:
a power supply apparatus for providing an operation power;
a magnetic detecting apparatus, comprising:
a magnetic north pole detecting unit, having a first sensing unit and a first comparator, detecting a field intensity of magnetic north pole for obtaining a first detected result by using the first sensing unit, and determining a voltage level of a first triggering signal outputting to a first output terminal in accordance to a compare result obtained from comparing the first detected result with a predetermined value by using the first comparator; and
a magnetic south pole detecting unit, having a second sensing unit and a second comparator, detecting a field intensity of magnetic south pole for obtaining a second detected result by using the second sensing unit, and determining a voltage level of a second triggering signal outputting to a second output terminal in accordance to a compare result obtained from comparing the second detected result with a predetermined value by using the second comparator; and
a buffer unit for receiving and buffering the voltage levels of the first triggering signal and the second triggering signal.

2. The Hall Effect switching circuit of claim 1, wherein the magnetic north pole detecting unit further comprising an amplifier coupled between the first comparator and the first output terminal, and the amplifier amplifies a signal output from the first comparator to generate the first triggering signal.

3. The Hall Effect switching circuit of claim 1, wherein the magnetic south pole detecting unit further comprising an amplifier coupled between the second comparator and the second output terminal, and the amplifier amplifies a signal output from the second comparator to generate the second triggering signal.

4. The Hall Effect switching circuit of claim 1, further comprising an OR gate having two input terminals respectively coupled to the buffer unit for receiving the first triggering signal and the second triggering signal, and the OR gate performs an OR logic operation on the first and second triggering signals to generate a control signal.

5. The Hall Effect switching circuit of claim 4, further comprising a switch coupled to the OR gate to receive the control signal and the switch is determined whether to be turned on or not in accordance to the control signal.

6. An apparatus using Hall Effect switching circuit, comprising:
a magnetic field generator for generating a magnetic field; and
a Hall Effect switching circuit for detecting intensity of the magnetic field, comprising:
a power supply apparatus for providing an operation power; and
a magnetic detecting apparatus, comprising:
a magnetic north pole detecting unit, having a first sensing unit and a first comparator, detecting a field intensity of magnetic north pole for obtaining a first detected result by using the first sensing unit, and determining a voltage level of a first triggering signal outputting to a first output terminal in accordance to a compare result obtained from comparing the first detected result with a predetermined value by using the first comparator; and
a magnetic south pole detecting unit, having a second sensing unit and a second comparator, detecting a field intensity of magnetic south pole for obtaining a second detected result by using the second sensing unit, and determining a voltage level of a second triggering signal outputting to a second output terminal in accordance to a compare result obtained from comparing the second detected result with a predetermined value by using the second comparator; and
a buffer unit for receiving and buffering the voltage levels of the first triggering signal and the second triggering signal.

7. The apparatus of claim 6, wherein the magnetic north pole detecting unit further comprising an amplifier coupled between the first comparator and the first output terminal, and the amplifier amplifies a signal output from the first comparator to generate the first triggering signal.

8. The apparatus of claim 6, wherein the magnetic south pole detecting unit further comprising an amplifier coupled between the second comparator and the second output terminal, and the amplifier amplifies a signal output from the second comparator to generate the second triggering signal.

9. The apparatus of claim 6, further comprising an OR gate having two input terminals respectively coupled to the buffer unit for receiving the first triggering signal and the second triggering signal, and the OR gate performs an OR logic operation on the first and second triggering signals to generate a control signal.

10. The apparatus of claim 9, further comprising a switch coupled to the OR gate to receive the control signal and the switch is determined whether to be turned on or not in accordance to the control signal.

11. A method for using Hall Effect switching circuit, which is adapted to a Hall Effect switching circuit comprising a magnetic north pole detecting unit and a magnetic south pole detecting unit, wherein the magnetic north pole detecting unit having a first sensing unit and a first comparator, and the magnetic south pole detecting unit having a second sensing unit and a second comparator, the method comprises the steps of:
using the magnetic north pole detecting unit to detecting a field intensity of magnetic north pole when operation power is provided to the magnetic north pole detecting unit, such that a corresponding first triggering signal is generated accordingly;
using the magnetic south pole detecting unit to detecting a field intensity of magnetic south pole when operation power is provided to the magnetic south pole detecting unit, such that a corresponding second triggering signal is generated accordingly; and
buffering the first and second triggering signal respectively for controlling circuit operation.

12. The method of claim 11, wherein the step of buffering the first and second triggering signal respectively for controlling circuit operation comprises:
performing an OR logic operation on the first and second triggering signals to generate a corresponding control signal; and
determining whether to turn on a switch or not in accordance to the control signal.

* * * * *